(12) United States Patent
Heo et al.

(10) Patent No.: US 10,972,129 B2
(45) Date of Patent: Apr. 6, 2021

(54) LOW DENSITY PARITY CHECK CODE DECODER AND METHOD FOR DECODING LDPC CODE

(71) Applicant: Korea University Research and Business Foundation, Seoul (KR)

(72) Inventors: Jun Heo, Seoul (KR); Sung Sik Yoon, Seoul (KR); Byung Kyu Ahn, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 16/550,408

(22) Filed: Aug. 26, 2019

(65) Prior Publication Data

US 2020/0119750 A1   Apr. 16, 2020

(30) Foreign Application Priority Data

Oct. 12, 2018  (KR) .......................... 10-2018-0121866

(51) Int. Cl.
   *H03M 13/00*   (2006.01)
   *H03M 13/11*   (2006.01)
   *H03M 13/45*   (2006.01)

(52) U.S. Cl.
   CPC ...... *H03M 13/1117* (2013.01); *H03M 13/458* (2013.01); *H03M 13/6502* (2013.01)

(58) Field of Classification Search
   None
   See application file for complete search history.

(56) References Cited

U.S. PATENT DOCUMENTS

| | | | | |
|---|---|---|---|---|
| 2008/0074300 | A1* | 3/2008 | Cherubini | H03M 7/46 341/120 |
| 2008/0082868 | A1* | 4/2008 | Tran | H03M 13/1125 714/699 |
| 2009/0013238 | A1* | 1/2009 | Blanksby | H03M 13/6527 714/758 |

(Continued)

FOREIGN PATENT DOCUMENTS

KR   10-1630114 B1   6/2016

OTHER PUBLICATIONS

T. Wu, Y. Hu and C. Lee, "Optimization of memory utilization for partially parallel QC-LDPC decoder," 2010 International Symposium on Information Theory & Its Applications, Taichung, 2010, pp. 496-500, doi: 10.1109/ISITA.2010.5650137. (Year: 2010).*

(Continued)

*Primary Examiner* — Daniel F. McMahon
(74) *Attorney, Agent, or Firm* — NSIP Law (57) ABSTRACT

A check node update processor of the low density parity check (LDPC) code decoder includes: an approximate first minimum (AFM) condition check unit which checks whether a predetermined specific condition is satisfied, and a check node determining unit which sets an approximate minimum value as a size of an entire check node output when it is determined that the specific condition is satisfied as a checking result in the AFM condition check unit and calculates a first minimum value as a true minimum value and sets a second minimum value as an approximate minimum value when it is determined that the specific condition is not satisfied to determine a size of the check node output.

9 Claims, 4 Drawing Sheets

(56) References Cited

U.S. PATENT DOCUMENTS

2009/0249165 A1* 10/2009 Gracie ............... H03M 13/296
714/758
2016/0233883 A1* 8/2016 Sedighi ............ H03M 13/6569

OTHER PUBLICATIONS

Korean Notice of Allowance dated Feb. 28, 2020 in counterpart Korean Patent Application No. 10-2018-0121866 (2 pages in Korean).

* cited by examiner

LOW DENSITY PARITY CHECK CODE DECODER AND METHOD FOR DECODING LDPC CODE

CROSS-REFERENCE TO RELATED APPLICATIONS

This application claims the priority of Korean Patent Application No.10-2018-0121866 filed on Oct. 12, 2018, in the Korean Intellectual Property Office, the disclosure of which is incorporated herein by reference.

BACKGROUND

Field

The present disclosure relates to a decoder of a low density parity check code and a method for decoding the same.

Description of the Related Art

As the integration of an integrated circuit (IC) chip is accelerated, a chip implementation area is inevitably getting smaller so that efforts have been continued to design an internal function of the chip to be more simplified to consume less hardware resources. For the purpose of smooth communication, a role of an error correction code is very important and thus hardware complexity of a decoder is relatively higher than that of an encoder. In order to implement such a decoder, more resources may be consumed. Therefore, efforts have been attempted to reduce an implementation area of the decoder while minimizing the degradation of error correction capability.

When it is assumed that a code word length is sufficiently long, a low density parity check (hereinafter, abbreviated as "LDPC") code which is one of error correction codes which are being used in various communication system fields is a very excellent code which is capable of achieving channel capacity in accordance with a Shannon's limit. Performance of the LDPC code depends on a design method of a parity check matrix H. Parallelization is allowed in various forms depending on a code type so that it is suitable for a high speed wireless mobile communication to be adopted for a 5G standard.

An operation method of correcting an error using the LDPC code representatively includes belief propagation (BP) also known as a sum-product (SP) technique. However, the belief propagation requires a complex product operation and a hyperbolic tangent (tanh) operation so that complexity is very high when it is implemented. When a finite length code word, that is, a message using a fixed point representation used in actual implementation is used, unexpected performance degradation may occur. Therefore, despite the theoretically superior error correction capability, the implementation using this method is being avoided.

As a result, efforts have been continued to maintain theoretical maximum bit error rate (BER) performance while reducing implementation complexity and a representative alternative method for achieving this purpose is a min-sum (MS) or advanced MS method. According to the advanced MS method, an arbitrary normalization factor or an offset value is applied to the MS method to improve the performance to be similar to the SP method. In the MS-based decoding algorithm, a decoding function may be implemented using elements which consume relatively less hardware resources, such as a comparator, a MUX, and an adder.

The MS decoding algorithm is divided into a bit node (nodes disposed in a column) updating process and a check node (nodes disposed in a row) updating process. First, according to the bit node updating process, the error correction is performed using a result A obtained by adding all check-to-variable (C2V) messages (C2V input values) which are transmitted from check nodes connected by edges based on an arbitrary bit node and log likelihood ratio (LLR) values of a symbol received from the channel. Further, as an output of the bit node, a value obtained by subtracting check-to-variable input values from the result "A" is determined as an output of each edge. Next, according to a core operation process of the check node updating process, sizes of the absolute values of the variable-to-check (V2C) messages entering from bit nodes connected based on the arbitrary check node are compared to determine minimum values. Here, first and second values are obtained as minimum values and a second minimum value is transmitted only to a bit node which transmits a selected minimum value. A bit node which transmits the selected minimum value is considered as a bit node having the lowest reliability and a possibility having an error is the highest so that the second minimum value which serves as a compensation value of error correction is transmitted thereto.

In a process of calculating a minimum value in the check node, the hardware/calculation complexity is increased in proportion to the degree of check node and a used element is a minimum value generator (mVG) configured by a comparator and a MUX. The hardware implementation area may significantly vary in accordance with a utilizing method of the minimum value generator and the additional MUX. Therefore, it is necessary to develop various algorithms for the element utilizing technique.

Specifically, in the LDPC code, an error included in the code word is corrected by an iterative decoding method. According to the iterative decoding method, an arbitrary extrinsic information updating process is repeated and as the cumulative number thereof is increased, the error correction capability is improved. The LDPC code decoding process is mainly classified into a bit node updating process and a check node updating process. The errors are corrected by repeatedly performing two processes. In this case, there are several applicable mathematical algorithms and a sum product (SP) operation process is used to maximize the error correction capability of the LDPC code. According to the SP arithmetic process, a sum operation is used for a process of updating a bit node and a product operation is used for a process of updating a check node as represented in the following Equation 1.

(Check node update) [Equation 1]

$m \subseteq \{1, \ldots, M\}$ and $n \subseteq N_m$ $$u_{m,n}^{(l)} = -2\tanh^{-1}\left(\prod_{l \subseteq N_m - n} \tanh\left(\frac{-\lambda_l^{(l-1)} + u_{m,n}^{(l-1)}}{2}\right)\right)$$

(Bit node update)

$n \subseteq \{1, \ldots, N\}$ $$\lambda_n^{(l)} = \frac{2}{\sigma^2}r_n + \sum_{m \subseteq M_n} u_{m,n}^{(l)}$$

$$v_{n,m}^{(l)} = \frac{2}{\sigma^2}r_n + \sum_{m \subseteq M_n - m} u_{m,n}^{(l)}$$

In Equation 1, $U^{(l)}_{m,n}$ refers to a check node update value which is transmitted to a connected bit node during a l-th iterative decoding process and subscripts m, n refer to a value which is transmitted to an n-th bit node from an m-th check node. Further, Nm refers to a set of bit nodes connected to the m-th check node. Next, $\lambda^{(l)}_n$ refers to an updated value in the l-th iterative decoding process and refers to a probabilistic value of an n-th bit node. $v^{(l)}_{n,m}$ refers to a bit node update value which is transmitted to a connected check node. $\sigma^2$ refers to a noise power and $r_n$ refers to an n-th LLR value transmitted from the channel. As a result, a final binary bit result may be obtained by hard decision of a final bit node after repeatedly performing the above-described processes.

However, when the above-described processes are implemented by actual hardware elements, a product operation is excessively used and a triangular function such as tanh is also applied so that complexity is increased. As a representative method which significantly lowers the complexity, the Min-sum (MS) operation method is used so that even though the bit node updating process is the same as the existing method (sum operation), a product operation of the check node updating process is replaced with a comparator operation to significantly lower the complexity, which is represented in Equation 2.

(Check node update) [Equation 2]

$m \subseteq \{1, \ldots, M\}$ and $n \subseteq N_m$ $$u^{(l)}_{m,n} = \prod_{l \subseteq N_m - n} \text{sign}(\lambda^{(l-1)}_l) \cdot \min_{l \subseteq N_m - n} |\lambda^{(l-1)}_l|$$

Here, sign( ) is an operator which determines a sign and min( ) finds a minimum value. When Equation 2 is used, multiple bit product operation is changed to an exclusive-OR (XOR) operation of a single bit and a problem of finding a minimum value. Therefore, when the actual hardware is considered, an amount of hardware resources exponentially increases in proportion to a quantization level which is applied to each data. Therefore, it is considered that this method is more simplified than the SP method. However, when this method is used, the error correction capability is relatively degraded so that the normalized MS or offset MS method is considered to overcome this problem.

Figure 1:
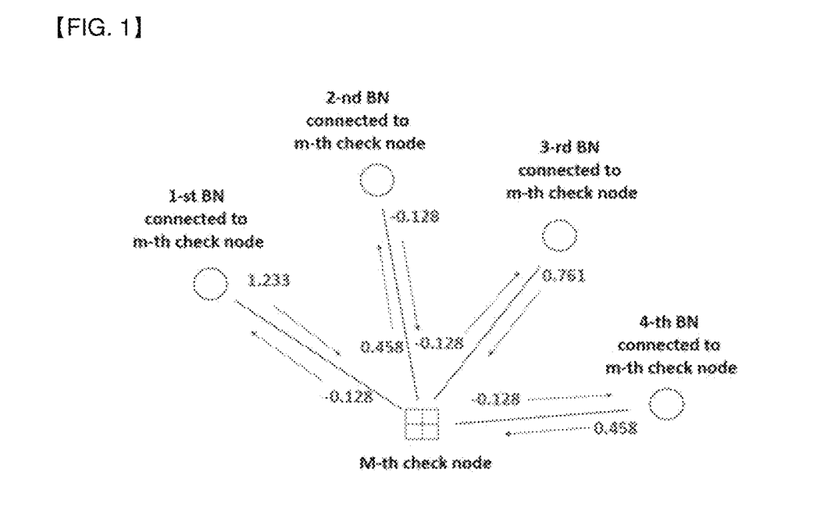
FIG. 1 | a view for explaining a check node updating process of an LDPC code MS decoding process.

FIG. 1 is a view for explaining a check node updating process of an LDPC code MS decoding process.

Referring to FIG. 1, a process of transmitting messages exchanged between bit nodes connected to an arbitrary m-th check node and a check node is illustrated. When the MS method is used, an output value may be represented by a first minimum value and a second minimum value.

Therefore, only four pieces of information including two minimum values excluding a code bit, a code having a one bit size of each output value, and bit node position information where the first minimum value is transmitted need to be managed. Therefore, bits consumed during the process of updating a check node of the SP and MS methods are as follows:

When it is assumed that 5 bit message is used and a degree of a check node is 16, (SP decoding method) 5×16=80 bits (MS decoding method) 4×2+16+4=28 bits.

While updating the check node, a part having the highest operation and implementation complexity is a part which calculates the minimum value. Further, in order to find two minimum values, (2N−3) minimum value generating units are necessary. Further, in a tree structure, (N−1) minimum value generating units are necessary to calculate a first minimum value and (N−2) minimum value generating units are necessary to calculate a second minimum value.

The minimum value generating units are implemented using a comparator and a MUX. Therefore, studies are being carried out to reduce the number of elements and the area thereof by rearranging the comparator and the MUX and it has been found that when the tree structure is used, the number of elements and the area may be minimized.

Figure 2:
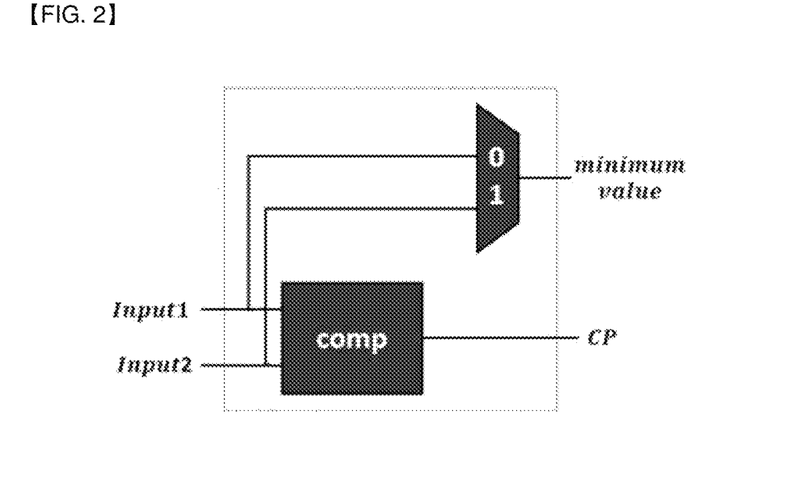
FIG. 2 is a schematic diagram of an internal comparator and a MUX of a minimum value generating unit.

FIG. 2 is a schematic diagram of an internal comparator and a MUX of a minimum value generating unit.

Referring to FIG. 2, one minimum value generating unit is configured by one comparator and one MUX and has two inputs/outputs. Further, the output generates one bit cp information for estimating a smaller value between two inputs and a minimum value subscript thereafter. As a result, in order to reduce a consumed hardware amount, a key point is how to dispose a minimum value generating unit, an external comparator, and a MUX element.

As described above, a method for reducing an installation area of the minimum value generating unit and a technique for determining a saturation standard point used for a bit node updating process to minimize the degradation of the error correction capability have been studied.

SUMMARY

An object of the present disclosure is to provide an LDPC code decoder and a decoding method thereof which decode an LDPC code using a predetermined approximate minimum value when a specific condition is satisfied, thereby reducing hardware complexity.

Another object of the present disclosure is to provide an LDPC code decoder and a decoding method thereof which lower a quantization level of a true minimum value generating unit to calculate a true minimum value.

According to an aspect of the present disclosure, a check node update processor of an LDPC code decoder includes an AFM condition check unit which checks whether a predetermined specific condition is satisfied and a check node determining unit which sets an approximate minimum value as a size of an entire check node output when it is determined that the specific condition is satisfied as a checking result in the AFM condition check unit and calculates a first minimum value as a true minimum value and estimates a second minimum value as an approximate minimum value when it is determined that the specific condition is not satisfied to determine a size of the check node output.

The AFM condition check unit may be configured by an AND gate with a tree structure.

The AFM condition check unit may make a decision using one bit information of each variable-to-check message.

The check node determining unit may include a MUX which selectively determines an output value in accordance with a result value generated from the AFM condition check unit.

The check node determining unit may include an approximate value usage condition generating unit which determines whether to use the approximate minimum value and may be connected to a true minimum value generating unit which calculates the true minimum value.

The true minimum value generating unit may generate a true minimum value by lowering a quantization level in accordance with a result value transmitted from the AFM condition check unit.

According to another aspect of the present disclosure, a check node update processor of an LDPC code decoder includes an AFM condition check unit which determines whether a reference quantization level of check node input values is saturated using one bit information of each variable-to-check message; and a minimum value generating unit which generates a minimum value by lowering a quantization level in accordance with a result value transmitted from the AFM condition check unit.

According to still another aspect of the present disclosure, a decoding method of an LDPC code decoder includes: checking whether a predetermined specific condition is satisfied using one bit information from each variable-to-check message, determining a size of the check node output by setting an approximate minimum value as a size of the entire check node when the specific condition is satisfied and calculating a true minimum value to be set as a first minimum value and set a second minimum value as the approximate minimum value when the specific condition is not satisfied, and decoding using the size of the check node output.

According to the present disclosure, when a specific condition is satisfied, an approximate minimum value is used to reduce a resource amount consumed when the hardware of the LDPC code is implemented.

Further, the quantization level of the minimum value generating unit is lowered so that even when the true minimum value is calculated, the entire consumed hardware resource amount may be reduced.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Those skilled in the art may make various modifications to the present invention and the present invention may have various embodiments thereof, and thus specific embodiments will be described in detail with reference to the drawings. However, this does not limit the present invention within specific exemplary embodiments, and it should be understood that the present invention covers all the modifications, equivalents and replacements within the spirit and technical scope of the present invention. In the description of respective drawings, similar reference numerals designate similar elements.

Terms such as first, second, A, or B may be used to describe various components, but the components are not limited by the above terms. The above terms are used only to discriminate one component from the other component. For example, without departing from the scope of the present invention, a first component may be referred to as a second component, and similarly, a second component may be referred to as a first component. A term of and/or includes a combination of a plurality of related elements or any one of the plurality of related elements.

It should be understood that, when it is described that an element is "coupled" or "connected" to another element, the element may be directly coupled or directly connected to the other element or coupled or connected to the other element through a third element. In contrast, when it is described that an element is "directly coupled" or "directly connected" to another element, it should be understood that no element is present therebetween.

Terms used in the present application are used only to describe a specific exemplary embodiment but are not intended to limit the present invention. A singular form may include a plural form if there is no clearly opposite meaning in the context. In the present invention, it should be understood that terminology "include" or "have" indicates that a feature, a number, a step, an operation, a component, a part or the combination thoseof described in the specification is present, but does not exclude possibility of presence or addition of one or more other features, numbers, steps, operations, components, parts or combinations, in advance.

If it is not contrarily defined, all terms used herein including technological or scientific terms have the same meaning as those generally understood by a person with ordinary skill in the art. Terms defined in generally used dictionary shall be construed that they have meanings matching those in the context of a related art and shall not be construed in ideal or excessively formal meanings unless they are clearly defined in the present application.

In the specification and the claim, unless explicitly described to the contrary, the word "comprise" and variations such as "comprises" or "comprising", will be understood to imply the inclusion of stated elements but not the exclusion of any other elements.

Hereinafter, exemplary embodiments according to the present disclosure will be described in detail with reference to accompanying drawings.

Figure 3:
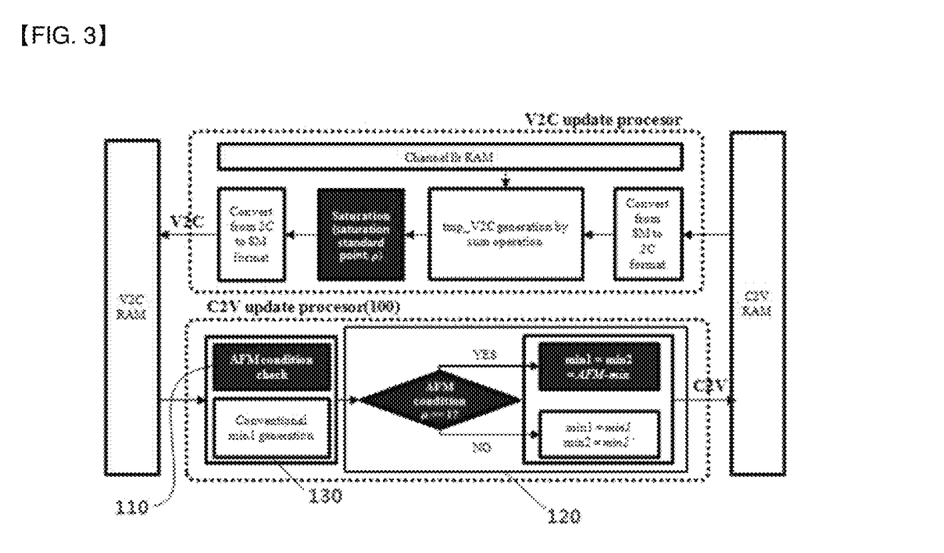
FIG. 3 is a schematic block diagram of an LDPC code decoder according to an exemplary embodiment of the present disclosure.

FIG. 3 is a schematic block diagram of an LDPC code decoder according to an exemplary embodiment of the present disclosure.

Referring to FIG. 3, an LDPC code decoder according to an exemplary embodiment of the present disclosure includes a variable node (V2C) update processor and a check node (C2V) update processor 100.

First, the variable node update processor calculates a probability value of each bit node and a temporary V2C value which is not subjected to a saturation process by a sum operation with respect to a bit node. In this case, each temporary V2C value needs to be saturated before establishing a final V2C value. For example, the saturation is performed to keep a seven bit quantization level which is defined in advance and when a size of the temporary V2C exceeds +7.75 or less than −7.75, the absolute value is changed to be within 7.75. That is, a standard point for saturation is 7.75 which is a maximum size which can be represented by 7 bits.

The variable node update processor according to the present disclosure includes a component which determines a saturation standard point and may set the saturation standard point to be smaller than a value which can be represented by a maximum bit number. For example, when the saturation standard point is set to be "3.0", if a size of an approximate minimum value is 6.75, it can be represented at a 7-bit quantization level. However, since the saturation standard point is set to be low, the approximate minimum value is saturated to 7.75 which is a representable maximum value so that the hardware complexity of implementation of a check node update processor which is a subsequent process may be lowered.

Next, the check node update processor 100 checks whether to use an approximate value in a check node at first and simultaneously performs a process of generating a minimum value for generating a true minimum value.

Specifically, the check node update processor 100 includes an AFM condition check unit 110 and a check node determining unit 120. The check node determining unit 120 stores an approximate minimum value which is defined in advance in a register area. Further, the check node update processor 100 may further include a true minimum value generating unit 130.

The AFM condition check unit 110 may check whether a predetermined specific condition is satisfied. The AFM condition check unit 110 may be configured by an AND gate with a tree structure and make a decision using one bit information from each variable-to-check (V2C) message. That is, the AFM condition check unit 110 determines whether to use the approximate minimum value through a logical AND gate operation process of one bit of each V2C message.

When it is determined that the specific condition is satisfied as a checking result of the AFM condition check unit 110, the check node determining unit 120 may set the approximate minimum value as a size of the entire check node. Further, when it is determined that the specific condition is not satisfied, the check node determining unit 120 calculates the first minimum value as a true minimum value and sets a second minimum value as an approximate minimum value to determine the size of the check node. When an AND gate operation result value η is "1", the check node determining unit 120 uses the approximate minimum value as a C2V output and when the AND gate operation result value is "0", the check node determining unit 120 uses a true minimum value obtained by the true minimum value generating unit 130 as a C2V output. When the approximate minimum value is used, the check node determining unit 120 equally assigns the approximate minimum value to all C2V output values and when the true minimum value is used, a second minimum value needs to be obtained. In this case, second minimum value approximation techniques of the related art are combined to determine the C2V output.

A process of updating a check node according to the present disclosure is as represented in Equation 3.

$m \subseteq \{1, \ldots, M\}$ and $n \subseteq N_m$ [Equation 3]

$$u_{m,n}^{(l)} = \prod_{l \subseteq N_m - n} \text{sign}(\lambda_l^{(l-1)}) \cdot \min_{l \subseteq N_m - n} |\lambda_l^{(l-1)}|$$

-continued when λ is 0:

$$\min_{l \subseteq N_m - n} |\lambda_l^{(l-1)}| = \begin{cases} \text{MIN2}_{AFM}, & 1st\ \text{MIN} = |\lambda_l^{(l-1)}| \\ \text{MIN1}, & \text{otherwise} \end{cases}$$

when λ is 1:

$$\min_{l \subseteq N_m - n} |\lambda_l^{(l-1)}| = \text{MIN1}_{AFM}$$

In this case, $\text{MIN2}_{AFM}$ refers to a second minimum value obtained by the approximation technique of the related art and $\text{MIN1}_{AFM}$ refers to a first approximate minimum value used when the specific condition is satisfied.

The LDPC code decoder according to the present disclosure uses a quantized data value and each data may be set to have a seven bit size. A first bit of seven bit data indicates a sign so that when the first bit is 0, it means a positive sign and when the first bit is 1, it means a negative sign. The remaining four bits indicate an integer part and the remaining two bits indicate a fractional part. Each bit indicates an exponent value of 2, a range of representable value is "−15.75" to "+15.75", and a data interval is 0.25. The reason why the reference quantization level is set to be 7 bits is that 7 bits are selected by a number of experiments to minimize a degree of performance deterioration due to the quantization level. The reference quantization level may be set to various values depending on a decoding method. Hereinafter, it will be described in more detail with reference to a hardware structure of FIG. 4.

Figure 4:
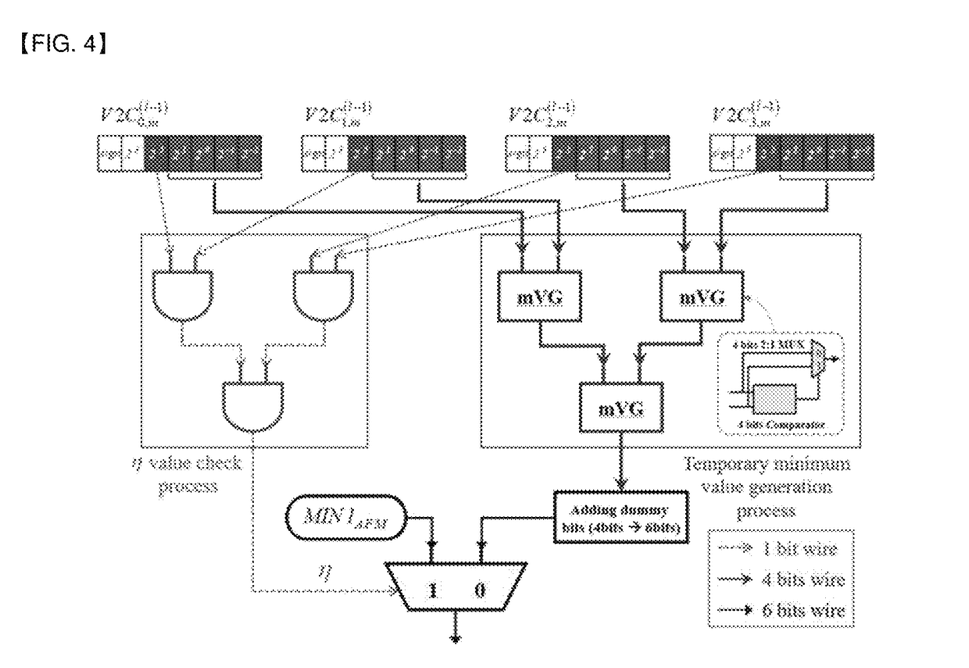
FIG. 4 is a view for explaining a structure of a check node update processor of an LDPC code decoder according to an exemplary embodiment of the present disclosure.

FIG. 4 is a view for explaining a structure of a check node update processor of an LDPC code decoder according to an exemplary embodiment of the present disclosure.

Referring to FIG. 4, a check node update processor of the LDPC code decoder according to an exemplary embodiment of the present disclosure has a logical AND gate tree structure which creates a η value for determining whether to use the approximate minimum value. An example that an input of each AND gate is $2^2$-th one bit of C2V messages which are input to the corresponding check node and when a size of the absolute value of the V2C message is 4 or larger, the saturation is performed will be described.

$2^2$-th one bit of C2V messages is considered as an input of the logical AND gate with a tree structure to obtain a result value η and it is determined whether the specific condition is satisfied using the result value η.

A degree of reduced quantization level relates to a saturation standard point in the bit node. When 4 is considered as a saturation standard point in the bit node and sizes of all V2C messages exceed 4, the V2C messages are saturated. As a result, a comparison of the sizes of the V2C messages is valid only for lower four bits of $2^2$-th bits. As a result, an amount of consumed hardware resources may be reduced due to the reduced quantization level.

The minimum value generating unit is configured by a comparator and a MUX and consumes a significant amount of hardware resources and the consumed hardware resources non-linearly increases in proportion to a configuration bit number. Specifically, the minimum value generating unit uses a 4-bit comparator and a 4-bit 2:1 MUX to generate one output. In this case, the minimum value generating unit lowers the hardware complexity by lowering a quantization level. The minimum value generating unit with a tree structure is used to generate a 4-bit output and a dummy bit "00" is added to a most significant bit of the approximate minimum value to transmit the bits to the MUX in order to satisfy the quantization level of the C2V output, that is, 6 bits.

For example, it is assumed that an input/output degree of an arbitrary check node is 4 and the V2C message is 7-bit binary numbers 0001101(=3.25), 0111111 (=15.75), 0001001 (=2.25), 0000111(=1.75). In this case, $2^2$-th bits which are 0, 1, 0, and 0 are input to the input of the logical AND gate. Therefore, η is 0. Further, the input of the minimum value generator is configured by lower four bits of each V2C message which are 1101 (=3.25), 1111 (=3.75), 1001 (=2.25), and 0111 (=1.75). As a result, the approximate minimum value is 0111 (=1.75). Since η is 0, the approximate minimum value is determined as a final minimum value. As another example, when it is assumed that all C2V input messages are 0111111, it means that all the corresponding messages are saturated in each connected bit node, so that η is 1. Regardless of the approximate minimum value result, 3.75 is determined as a final minimum value at all times.

According to the present disclosure, even though the tree structure of the logical AND gate is added to determine the specific condition, a single bit is input/output, so that it is implemented at a significantly lower scale than the minimum value generating unit and the entire hardware complexity may be lowered.

Figure 5:
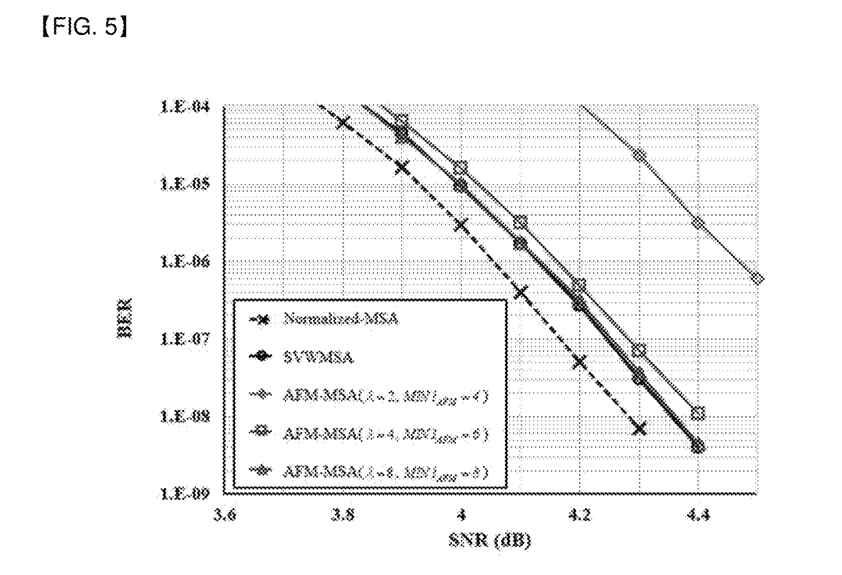
FIG. 5 is a simulation result of an error correction performance when an LDPC code decoding method according to an exemplary embodiment of the present disclosure and an SVWMS technique are combined.
Figure 6:
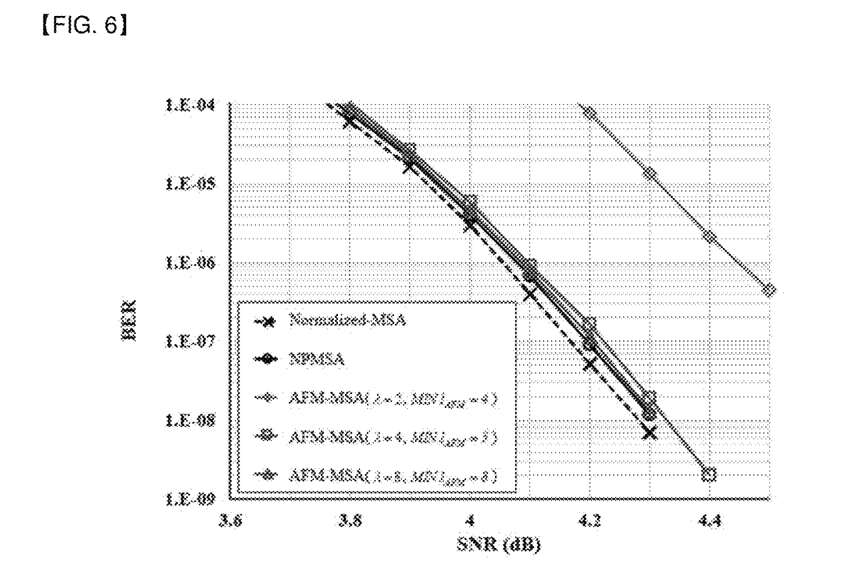
FIG. 6 is a simulation result of an error correction performance when an LDPC code decoding method according to an exemplary embodiment of the present disclosure and an NPMS technique are combined.

FIG. 5 is a simulation result of an error correction performance when an LDPC code decoding method according to an exemplary embodiment of the present disclosure and an SVWMS technique are combined and FIG. 6 is a simulation result of an error correction performance when an LDPC code decoding method according to an exemplary embodiment of the present disclosure and an NPMS technique are combined.

Referring to FIGS. 5 and 6, a simulation result of a bit error rate (BER) performance curve when the LDPC code decoding method according to the present disclosure is combined with the SVWMS and NPMS techniques is illustrated. A code word length is 2048, a code rate is approximately 0.84, each of degrees of a bit node and degree of a check node is 6 and 32, respectively, which is normal distribution degrees.

Commonly, a normalization factor is set to be 0.5 and a quantization level is set to be 7 bits, and experiments are performed to know how the performance varies depending on a saturation standard point in the bit node which is $2^1$, $2^2$, and $2^3$, that is, 2, 4, and 8, respectively. Referring to FIG. 5, a first minimum value is calculated using a simple field variable weighted Min-sum (SVWMS) method and an offset value which varies depending on the number of iterative decoding times is added to generate a second minimum value. Basically, according to the SVWMS method, the performance is approximately 0.1 dB BER lower than the normalized MS method. Further, when the saturation standard point is assumed to be 8, the error correction capability is not degraded as compared with the SVW. When the saturation standard point is reduced to 4 or 2, the performance gap is gradually increased so that the saturation standard point is determined to be 4 to efficiently reduce the hardware resource while minimizing the degradation of the error correction capability.

Referring to FIG. 6, a normalized probabilistic Min-Sum (NPMS) method is used as an approximation technique of a second minimum value. According to the NPMS method, V2C messages are divided into two groups and then a minimum value of each group is calculated. A smaller one of the minimum values is used as a first minimum value and a larger one is used as a second minimum value.

According to this method, the larger the degree of the check node, the smaller the degradation of the error correction capability. Further, when the saturation standard point is 2, the degree of the BER performance degradation is large, but when the saturation standard point is selected to be 4 or 8, the error correction capability is excellent. As a result, it is confirmed that when the algorithm of the present disclosure is applied, there is almost no adverse effect on the error correction capability.

Figure 7:
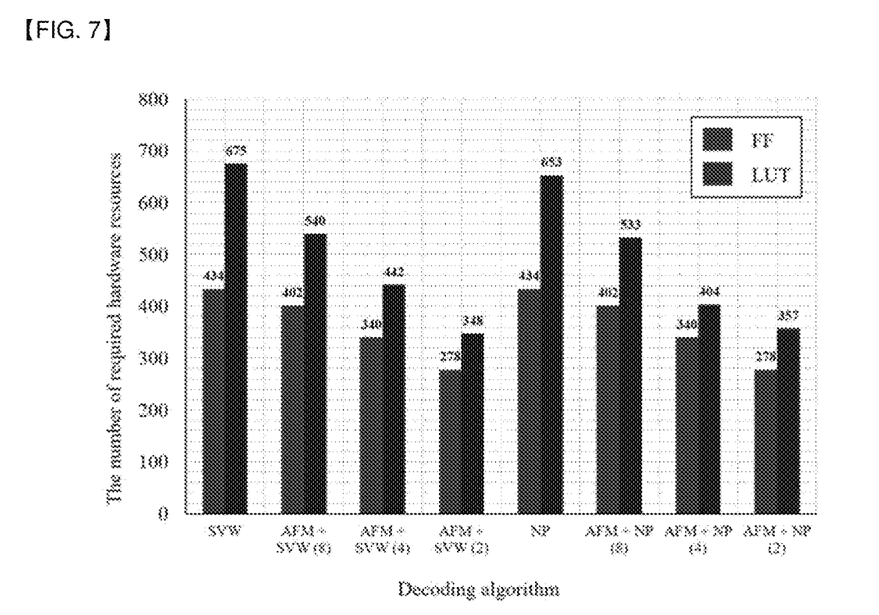
FIG. 7 is a view illustrating a hardware amount consumed when an LDPC code decoder according to an exemplary embodiment of the present disclosure is implemented by an FPGA.

FIG. 7 is a view illustrating a hardware amount consumed when an LDPC code decoder according to an exemplary embodiment of the present disclosure is implemented by an FPGA.

Referring to FIG. 7, the simulation is implemented based on a single check node by utilizing Vivado 14.4 synthesys/implementation tool of Xilinx Inc. and the program created using Verilog language.

The implementation is performed by comparing an example that only the second minimum value approximation technique of the related art is applied and an example that both the second minimum value and approximate minimum value usage techniques are applied. The FPGA is implemented based on a consumed amount of FF (flip-flop) and the Slice LUT which are the most core elements and the number in the parentheses indicates a saturation standard point. In both the SVWMS and NPMS, as the standard point value becomes smaller, the hardware saving effect becomes more remarkable. As described for the error correction capability, it is confirmed that when the saturation standard point which minimizes the degradation of the BER is selected to be 4, the FF may reduce approximately 22% of hardware resources and the Slice LUT may reduce approximately 35 to 39% of the hardware resources.

A check node update processor of an LDPC code decoder according to another exemplary embodiment of the present disclosure may be configured to include only an AFM condition check unit and a minimum value generating unit. Specifically, the AFM condition check unit determines whether the reference quantization level of the check node input values is saturated using one bit information of each variable-to-check message. The minimum value generating unit may generate a minimum value by lowering the quantization level.

A decoding method of an LDPC code decoder according to another exemplary embodiment of the present disclosure includes a step of checking whether a predetermined specific condition is satisfied using one bit information from each variable-to-check message, a step of determining a size of the check node output by setting an approximate minimum value as a size of the entire check node when the specific condition is satisfied and calculating a true minimum value to be set as a first minimum value and set the approximate minimum value as a second minimum value when the specific condition is not satisfied, and a step of decoding using the size of the check node output.

The present disclosure suggests an effective design method having low complexity to reduce hardware implementation complexity of an error correction code decoder which is widely applied to various wired/wireless communication systems and integrated circuit fields such as wired/wireless communication, mobile communication, satellite communication, optical communication, and memory and an effect is verified by a simulation result.

It will be appreciated that various exemplary embodiments of the present invention have been described herein for purposes of illustration, and that various modifications, changes, and substitutions may be made by those skilled in the art without departing from the scope and spirit of the present invention. Therefore, the exemplary embodiments of the present disclosure are provided for illustrative purposes only but not intended to limit the technical concept of the present disclosure. The scope of the technical concept of the present disclosure is not limited thereto. The protection scope of the present disclosure should be interpreted based on the following appended claims and it should be appreciated that all technical spirits included within a range equivalent thereto are included in the protection scope of the present disclosure.

What is claimed is:

1. A low density parity check (LDPC) code decoder, comprising:
    a variable node update processor; and
    a check node update processor configured to determine minimum values by comparing sizes of absolute values of variable-to-check messages entering from variable nodes connected based on an arbitrary check node,
    wherein the check node update processor includes:
    an approximate first minimum (AFM) condition check unit comprising an AND gate configured to check whether a predetermined specific condition is satisfied through a logical AND gate operation process of one bit of each variable-to-check message; and
    a check node determining unit which, when it is determined that the predetermined specific condition is satisfied as a checking result in the AFM condition check unit, sets an approximate minimum value as a size of an entire check node output, and when it is determined that the predetermined specific condition is not satisfied, sets a calculated minimum value obtained by a minimum value generating unit as a size of a check node output.

2. The LDPC code decoder according to claim 1, wherein the AFM condition check unit is configured by the AND gate with a tree structure, and
    wherein the check node determining unit, when an AND gate operation result value is 1, uses the approximate minimum value as the entire check node output, and when the AND gate operation result value is 0, the check node determining unit uses a minimum value obtained by the minimum value generating unit as the check node output.

3. The LDPC code decoder according to claim 1, wherein the AFM condition check unit makes a decision using one bit information of each variable-to-check message.

4. The LDPC code decoder according to claim 1, wherein the check node determining unit includes a multiplexer (MUX) which selectively operates in accordance with a result value generated from the AFM condition check unit.

5. The LDPC code decoder according to claim 4, wherein the check node determining unit includes an approximate value usage condition generating unit which determines whether to use the approximate minimum value and is connected to a true minimum value generating unit which calculates a true minimum value.

6. The LDPC code decoder according to claim 5, wherein the true minimum value generating unit generates the true minimum value by lowering a quantization level in accordance with the result value transmitted from the AFM condition check unit.

7. A low density parity check (LDPC) code decoder, comprising:
    a variable node update processor; and
    a check node update processor configured to determine minimum values by comparing sizes of absolute values of variable-to-check messages entering from variable nodes connected based on an arbitrary check node,
    wherein the check node update processor includes:
    an approximate first minimum (AFM) condition check unit which determines whether a reference quantization level of check node input values is saturated using one bit information of each variable-to-check message; and
    a minimum value generating unit which generates a minimum value by lowering a quantization level in accordance with a result value transmitted from the AFM condition check unit.

8. A decoding method of a low density parity check (LDPC) code decoder comprising a variable node update processor, and a check node update processor configured to determine minimum values by comparing sizes of absolute values of variable-to-check messages entering from variable nodes connected based on an arbitrary check node, the method comprising:
    checking whether a predetermined specific condition is satisfied using one bit information from each variable-to-check message;
    setting an approximate minimum value as a size of an entire check node output, when the predetermined specific condition is satisfied;
    setting a calculated minimum value obtained by a minimum value generating unit as a size of a check node output, when the predetermined specific condition is not satisfied; and
    decoding using the size of the check node output.

9. The decoding method according to claim 8, wherein the check node update processor comprises an approximate first minimum (AFM) condition check unit including an AND gate configured to make a decision using the one bit information from each variable-to-check message.

* * * * *